(12) United States Patent
Chen et al.

(10) Patent No.: US 10,109,365 B2
(45) Date of Patent: Oct. 23, 2018

(54) WORD LINE DRIVER

(71) Applicant: Taiwan Semiconductor Manufacturing Company Limited, Hsinchu (TW)

(72) Inventors: Yuhsiang Chen, Hsinchu County (TW); Shao-Yu Chou, Hsinchu County (TW); Yu-Der Chih, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/492,156

(22) Filed: Apr. 20, 2017

(65) Prior Publication Data

US 2018/0151239 A1    May 31, 2018

Related U.S. Application Data

(60) Provisional application No. 62/426,707, filed on Nov. 28, 2016.

(51) Int. Cl.
*G11C 8/00* (2006.01)
*G11C 17/18* (2006.01)

(52) U.S. Cl.
CPC .................................. *G11C 17/18* (2013.01)

(58) Field of Classification Search
CPC .................................................... G11C 17/18
USPC ...................................... 365/189.11, 230.06
See application file for complete search history.

(56) References Cited

U.S. PATENT DOCUMENTS

| | | | | |
|---|---|---|---|---|
| 5,202,855 A | * | 4/1993 | Morton | G11C 11/4085 365/189.11 |
| 5,341,334 A | * | 8/1994 | Maruyama | G11C 8/08 326/68 |
| 5,793,695 A | * | 8/1998 | Kohno | G11C 8/10 365/189.11 |
| 5,953,255 A | * | 9/1999 | Lee | G11C 11/5628 365/185.28 |
| 6,535,430 B2 | * | 3/2003 | Ogura | G11C 8/10 365/185.23 |
| 6,728,160 B1 | * | 4/2004 | Yang | G11C 7/1051 365/189.05 |
| 7,257,031 B2 | * | 8/2007 | Darrer | G11C 8/08 365/185.23 |

(Continued)

FOREIGN PATENT DOCUMENTS

| | | |
|---|---|---|
| KR | 20030056457 | 7/2003 |
| KR | 20110093552 | 8/2011 |

OTHER PUBLICATIONS

Taiwan Office Action; Application No. 106136094; dated Jun. 28, 2018.

(Continued)

*Primary Examiner* — Viet Q Nguyen
(74) *Attorney, Agent, or Firm* — Jones Day (57) ABSTRACT

A word line driver comprising a select word line level shifter configured to generate at least one output signal in the first voltage domain or a second voltage domain and a control word line level shifter coupled to the select word line level shifter and configured to generate at least one output signal in the second voltage domain or a third voltage domain based, at least in part, on the at least one output signal generated by the select word line level shifter.

20 Claims, 5 Drawing Sheets

(56) References Cited

U.S. PATENT DOCUMENTS

| | | | | |
|---|---|---|---|---|
| 7,471,286 B2* | 12/2008 | Chung | G09G 3/3677 | 345/211 |
| 7,835,201 B2* | 11/2010 | De Sandre | G11C 7/1051 | 365/185.18 |
| 8,488,396 B2* | 7/2013 | Lee | G11C 7/00 | 365/154 |
| 9,449,703 B1* | 9/2016 | Roy | G11C 16/30 | |
| 9,595,332 B2* | 3/2017 | Georgescu | G11C 16/08 | |
| 9,837,161 B2* | 12/2017 | Muller | G11C 16/28 | |
| 2002/0176273 A1* | 11/2002 | Kang | G11C 5/145 | 365/145 |
| 2003/0063518 A1* | 4/2003 | Fong | G11C 11/5692 | 365/230.06 |
| 2005/0013170 A1 | 1/2005 | Vimercati et al. | | |
| 2006/0044924 A1* | 3/2006 | Wada | G11C 8/10 | 365/230.06 |
| 2006/0202913 A1* | 9/2006 | Hayafuji | G09G 3/3233 | 345/44 |
| 2007/0001981 A1* | 1/2007 | Tahata | G09G 3/3674 | 345/98 |
| 2007/0047309 A1* | 3/2007 | Satoh | G11C 16/0466 | 365/185.17 |
| 2010/0157695 A1* | 6/2010 | Schreiber | G11C 5/145 | 365/189.11 |
| 2010/0165699 A1* | 7/2010 | Chen | G11C 17/16 | 365/96 |
| 2011/0085390 A1 | 4/2011 | Arsovski et al. | | |
| 2011/0310666 A1* | 12/2011 | Miida | G11C 16/10 | 365/185.11 |
| 2014/0177333 A1* | 6/2014 | Yang | G11C 8/08 | 365/185.2 |
| 2015/0009751 A1* | 1/2015 | Kulkarni | G11C 5/145 | 365/156 |
| 2015/0138867 A1* | 5/2015 | Kirihata | H03K 19/017509 | 365/104 |
| 2016/0373092 A1* | 12/2016 | Storms | H03K 3/35613 | |

OTHER PUBLICATIONS

Korean Office Action; Application No. 10-2017-0083533; dated Jul. 23, 2018.

* cited by examiner

| Mode/Node | VDD_SWL | VDD_CWL | PGM_IO | PGMB_IO | PGMB_5V | PGM_5V | SEL | SEL_SWL | SELB_SWL | SWL | SELB_CWL | CWL | VCLM P1 | VCLM P2 |
|---|---|---|---|---|---|---|---|---|---|---|---|---|---|---|
| Select PGM WL | IO power | 5V power | IO power | 0 | IO power | 5V | Core power | IO power | 0 | IO power | 0 | 5V power | IO power | IO power |
| Unselect PGM WL | IO power | 5V power | IO power | 0 | IO power | 5V power | 0 | 0 | IO power | 0 | 5V power | 0 | IO power | IO power |
| Selected Read WL | Core power | IO power | 0 | IO power | IO power | 0 | Core power | Core power | 0 | Core power | 0 | IO power | 0 | IO power |
| Unselected Read WL | Core power | IO power | 0 | IO power | IO power | 0 | 0 | 0 | IO power | 0 | IO power | 0 | 0 | IO power |

WORD LINE DRIVER

CROSS-REFERENCE TO RELATED APPLICATIONS

This application claims priority to U.S. Provisional Application No. 62/426,707, filed Nov. 28, 2016, entitled "Word Line Driver," which is incorporated herein by reference in its entirety.

TECHNICAL FIELD

This relates to a word line driver and more particularly to word line driver circuits and associated methods which may be used in two-transistor memory cells and one-time programmable non-volatile memory.

BACKGROUND

Semiconductor memory devices generally consist of an array of memory cells and associated control circuitry. Each memory cell may consist of one or more transistors and the control circuitry may include word line drivers and bit line drivers. The array of memory cells may be arranged in a two-dimensional array such that any particular memory cell is located at the intersection of a particular row-column address. The row-column address may be selected using the corresponding word line driver and bit line driver. Typically, the word line driver is coupled to the gates of each transistor in a specified row and the bit line drivers are coupled to the source/drain of each transistor in a specified column. Accordingly, by applying different combinations of signals to the word line drivers and the bit line drivers, individual memory cells can be selected and controlled.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the term "word line" may be abbreviated as WL; the term "select word line" may be abbreviated as SWL; and the term "control word line" may be abbreviated as CWL.

The word line drivers described herein may be implemented in various types of semiconductor memory devices. One such type of semiconductor memory device is referred to as a one-time programmable (OTP) non-volatile memory. Once data is written to the memory cells of an OTP memory, the data is permanently stored and can only be read from the memory cells.

In some semiconductor memory devices, including OTP memory, the word line driver may include two drivers per row of memory cells—one for selection and one for control. In certain implementations, methods and devices for controlling semiconductor memory devices of this type using a word line driver are complex, use a large number of devices and, therefore occupy a large layout area.

The present disclosure provides a word line driver that may address one or more disadvantages of existing word line drivers. In some embodiments, the word line driver may include a select word line level shifter coupled to a control word line level shifter such that in operation, the select word line level shifter generates an input for the control word line level shifter. In some embodiments, by serially coupling the control word line level shifter to the select word line level shifter, the resulting word line driver may be less complex and occupy a smaller layout area than if the level shifters were operated in parallel. In some embodiments, the word line driver may be implemented as part of a one-time programmable (OTP) non-volatile memory. In some embodiments, the word line driver may be implemented as part of a two transistor OTP non-volatile memory.

Figure 1:
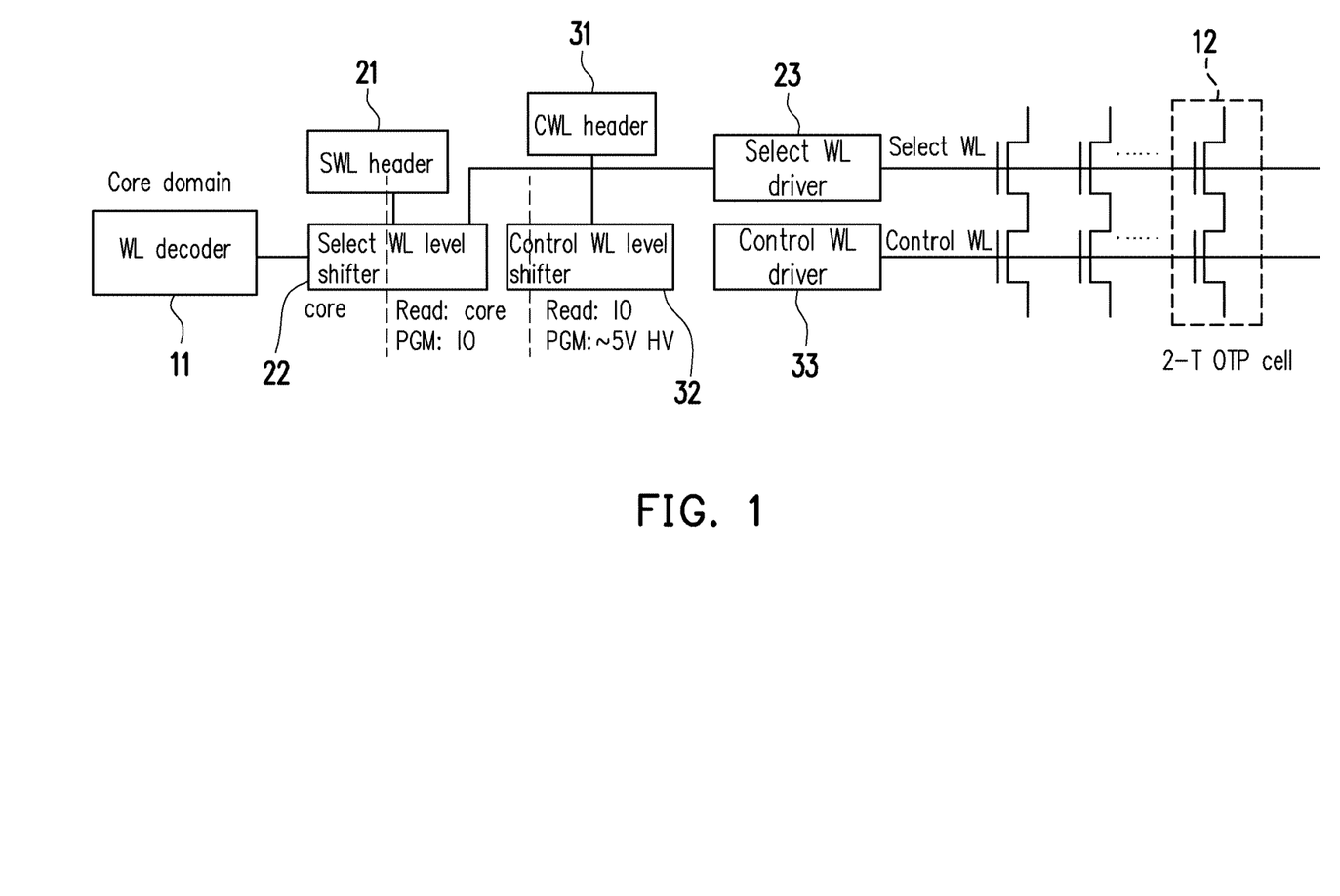
FIG. 1 is a schematic block drawing of an example of a word line driver, in accordance with some embodiments.

FIG. 1 is a schematic block drawing of an example of a word line driver, in accordance with some embodiments. As illustrated, the word line driver 10 comprises a word line decoder 11 coupled to a select word line level shifter 22. The select word line level shifter 22 is in turn coupled to a select word line driver 23 which is coupled to a memory cell 12 (e.g., a two transistor OTP memory cell) via a select word line. The select word line level shifter 22 is also coupled to a control word line level shifter 32. The control word line level shifter 32 is coupled to a control word line driver 33 which is coupled to the memory cell 12 via a control word line. A select word line header 21 is coupled to the select word line level shifter 22 and a control word line header 31 is coupled to the control word line level shifter 32. The select word line driver 23 and the control word line driver 33 cooperate to select one of a plurality of memory cells 12 associated with the select word line driver 23 and program and/or read data associated with the memory cell 12.

In memory devices, a first (e.g., lower) voltage domain may be provided to operate certain portions of the memory control circuitry and a second (e.g., higher) voltage domain may be utilized for the memory cells and corresponding drivers. To step from the first voltage domain to the second voltage domain, a level shifter may be utilized to shift the voltage level from the lower voltage domain of the control circuitry to the higher voltage domain of the memory cells and corresponding drivers. In some embodiments, the first voltage domain may be referred to as a core domain. In some embodiments, the core domain may be about 0.8 V. That is, the logical voltages in the core domain may be either 0 V or 0.8 V. In some embodiments, the second (e.g., higher) voltage domain may be referred to as an IO domain. In some embodiments, the IO domain may be about 1.8 V. That is, the logical voltages in the IO domain may be either 0 V or 1.8 V.

In operation, the word line decoder 11 generates a control signal (SEL) for controlling the select word line level shifter 22. The select word line level shifter 22 operates to shift the input voltage of the control signal (SEL) from a first voltage domain (e.g., a core domain) to a second voltage domain (e.g., an IO domain) in certain modes of operation, while enabling the SEL signal to operate in the first voltage domain in other modes of operation. The control word line level shifter 32 similarly shifts its output voltage to one of the second voltage domain and another voltage domain (e.g., a high voltage domain) depending on the mode of operation.

As noted above, in some embodiments, the voltage domain of the memory cells and corresponding drivers may vary depending on the desired operation. In particular, the voltage domain for a read operation may be different from the voltage domain for a programming operation. Additionally, the voltage domain of the selection operation may be different than the voltage domain for the control operation. In FIG. 1, different voltage domains for various components are labeled. For example, the word line decoder 11 is identified as being in the core domain. In the context of the select word line header 21, select word line level shifter 22 and the control word line level shifter 32, a vertical dashed line indicates that the input of the component operates in a specified voltage domain and that the output of the component operates at a potentially different voltage domain depending on the type of operation being performed (e.g., a read operation versus a programming operation). Accordingly, as illustrated, the voltage domain for the input of the select word line level shifter 22 may correspond to the core domain at the input regardless of the type of operation being performed. Meanwhile, the output of the select word line level shifter 22 operates in a core voltage domain (i.e., no level shifting) during a read operation. But, during a programming operation, that output of the select word line level shifter 22 operates at a higher voltage domain (e.g., the IO domain). In some embodiments, the output voltage domain of the word line level shifter 22 may depend on the voltage domain of the select word line header 21.

As for the control word line level shifter 32, the voltage domain of the input corresponds to the core domain during a read operation and to the IO domain during a programming operation by virtue of receiving the input signal from the select word line level shifter 22 at the associated voltage domain. When performing a read operation, the voltage domain of the output of the control word line level shifter 32 operates in the IO domain. In the case of the program operation, the voltage domain of the output of the control word line level shifter 32 corresponds to a high voltage (HV). For example, in some embodiments, the high voltage may be about 5 V. That is, the logical voltages in the high voltage domain may be either 0 V or 5 V.

In operation, the select word line header 21 and the control word line header 31 operate to control (e.g., select) the output voltage domain of the select word line level shifter 22 and the control word line level shifter 32, respectively. This functionality is described in more detail below with reference to FIGS. 2-4.

As illustrated in FIG. 1, the select word line level shifter 22 includes two outputs. One output is used as an input to the select word line driver 23 and the other output is used as an input to the control word line level shifter 32. As discussed above, by serially coupling the control word line level shifter 32 to the select word line level shifter 22, the resulting word line driver 10 may be less complex and occupy a smaller layout area than if the level shifters were operated in parallel (e.g., if both level shifters were controlled directly from the word line decoder 11). In some embodiments, this may be the case because the control word line level shifter 32 only has to shift output voltages by one domain (e.g., from core to IO domain or IO to 5 V domain). In particular, the control word line level shifter 32 outputs signals in either the IO domain or the 5 V domain. If the control word line level shifter 32 was controlled directly from the word line decoder 11, the control word line level shifter 32 would need to shift the core voltage by two levels to the 5 V domain during a programming operation. As a result, the resulting circuitry may be more complex than described herein. As described herein, a voltage shift from one domain to another refers to an increase or a decrease in the output voltage relative to an input voltage. If a device is operating in multiple voltage domains, shifting the voltage by one domain refers to increasing (or decreasing) the voltage domain to the next closest voltage domain. Shifting the voltage domain by two levels means an intermediate voltage domain is skipped.

In the embodiment illustrated in FIG. 1, the select word line driver 23 outputs a select word line signal to the memory cell(s) 12 in either the core or IO voltage domain. The control word line level shifter 32 outputs a signal to the control word line driver 33 and the control word line driver 33 outputs a control word line signal to the memory cell(s) 12 in either the IO or 5 V voltage domain.

Figure 2:
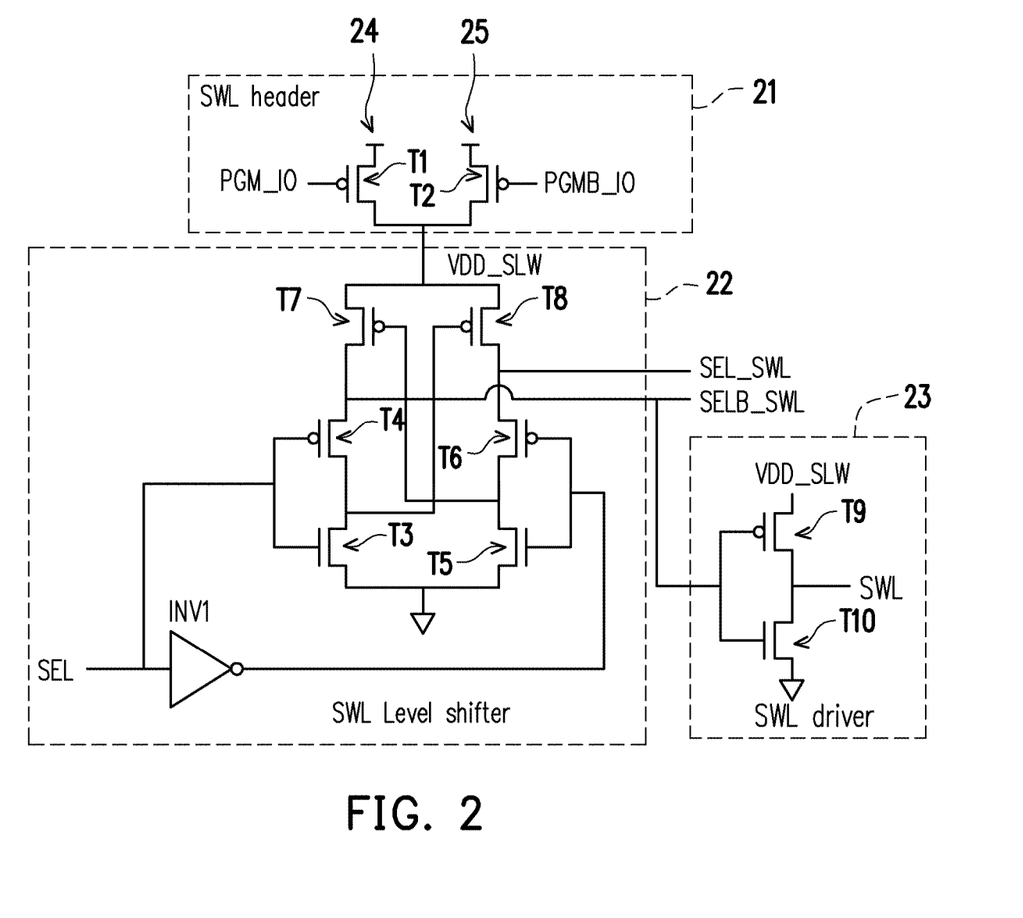
FIG. 2 is a schematic circuit drawing of an example of a select word line header, a select word line level shifter, and a select word line driver, in accordance with some embodiments.

FIG. 2 is a schematic circuit drawing of an example of a select word line header 21, a select word line level shifter 22, and a select word line driver 23 in FIG. 1, in accordance with some embodiments. As illustrated, the select word line header 21, the select word line level shifter 22, and the select word line driver 23 are implemented using a plurality of CMOS transistors.

The CMOS transistors described herein may be understood to operate like a switch. In an ON state the switch is closed and in an OFF state the switch is open. For NMOS transistors, when a voltage exceeding the threshold voltage of the NMOS transistor is applied to the gate, the NMOS transistor turns ON and current passes between the source and the drain, otherwise, the NMOS transistor is OFF and current is prevented from passing between the source and the drain. In the case of a PMOS transistor, when a voltage exceeding the threshold voltage of the PMOS transistor is applied to the gate, the PMOS transistor is OFF and current is prevented from passing between the source and the drain, otherwise, the PMOS transistor is ON and current passes between the source and the drain.

The circuit in FIG. 2 includes a power supply voltage corresponding to core power 24 (e.g., 0.8 V) and a power supply voltage corresponding to IO power 25 (e.g., 1.8 V). Input signals PGM_IO and PGMB_IO are used to select which voltage is applied to the select word line level shifter 22 and the select word line driver 23. The voltage applied to both circuits 22, 23 is identified in FIG. 2 as VDD_SWL. In operation, PGM_IO and PGMB_IO are complements of one another. That is, if PGM_IO is a logical high value, then PGMB_IO will be a logical low value and vice versa. In the example illustrated in FIG. 2, the PGM_IO and PGMB_IO inputs provide voltages in the IO domain.

In operation, the select word line header 21 operates to provide one of the core power 24 or the IO power 25 to the select word line level shifter 22 and select word line driver 23 via VDD_SWL. When PGM_IO is a logical high value and PGMB_IO is a logical low value, PMOS transistor T1 is OFF and PMOS transistor T2 is ON. Accordingly, VDD_SWL is equal to the IO power 25. When PGM_IO is a logical low value and PGMB_IO is a logical high value, PMOS transistor T1 is ON and PMOS transistor T2 is OFF. Accordingly, VDD_SWL is equal to the core power 24.

The select word line level shifter 22 receives an input signal (SEL) from the word line decoder 11. As described above, the input signal (SEL) may be in the core domain. In operation, if the input signal (SEL) is a logical high value, NMOS transistor T3 is ON and PMOS transistor T4 is OFF. Inverter INV1 inverts the input signal (SEL) so NMOS transistor T5 is OFF and PMOS transistor T6 is ON. The gate input signal to PMOS transistor T7 is a logical high so T7 is OFF and the gate input signal to NMOS transistor T8 is a logical low so T8 is ON. Since T8 is ON, the voltage at SEL_SWL is a logical high equal to VDD_SWL—either in the core domain or the IO domain. The complement (SELB_SWL) is a logical low. If the input signal (SEL) is a logical low value, the operation of the select word line level shifter is reversed. That is, the output SEL_SWL is a logical low value and the complement signal (SELB_SWL) is a logical high equal to VDD_SWL.

The SELB_SWL signal is sent to the select word line driver 23. As depicted in FIG. 2, the select word line driver 23 which includes transistors T9 and T10 is an inverter circuit. Accordingly, if SELB_SWL is a logical low value, the output of the select word line driver 23 is equal to VDD_SWL (T9 is ON and T10 is OFF) and if SELB_SWL is a logical high value, the output of the select word line driver 23 is equal to a logical low value (T9 is OFF and T10 is ON).

Figure 3:
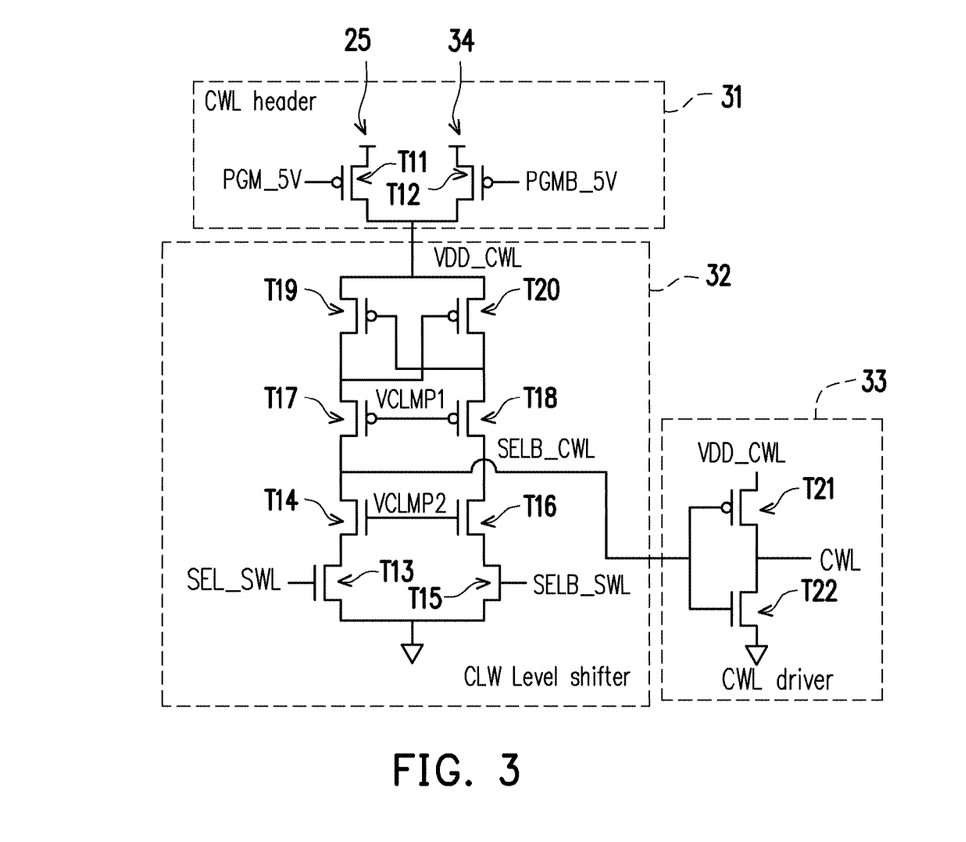
FIG. 3 is a schematic circuit drawing of an example of a control word line header, a control word line level shifter, and a control word line driver, in accordance with some embodiments.

FIG. 3 is a schematic circuit drawing of an example of a control word line header 31, a control word line level shifter 32, and a control word line driver 33 in FIG. 1, in accordance with some embodiments. As illustrated, the control word line header 31, the control word line level shifter 32, and the control word line driver 33 are implemented using a plurality of CMOS transistors.

The circuit in FIG. 3 includes a power supply voltage corresponding to IO power 25 (e.g., 1.8 V) and a power supply voltage corresponding to a 5 V power 34. Input signals PGM_5V and PGMB_5V are used to select which voltage is applied to the control word line level shifter 32 and the control word line driver 33. The voltage applied to both circuits 32, 33 is identified in FIG. 3 as VDD_CWL. In operation, PGM_5V and PGMB_5V may be a logical high value or a logical low value. For example, in the example illustrated in FIG. 5, the PGM_5V may provide voltages in the 5 V domain and the PGMB_5V may provide voltages in the IO domain. In some embodiments, even the logical high value in the IO domain may not be sufficient to exceed the threshold value of the corresponding transistor.

In operation, the control word line header 31 operates to provide one of the 10 power 25 or the 5 V power 34 to the control word line level shifter 32 and control word line driver 33 via VDD_CWL. When PGM_5V is a logical high value in the 5 V domain and PGMB_5V is a logical high value in the IO domain, PMOS transistor T11 is OFF and PMOS transistor T12 is ON. Accordingly, VDD_CWL is equal to the 5 V power 34. When PGM_5V is a logical low value in the 5 V domain and PGMB_5V is a logical high value in the IO domain, PMOS transistor T11 is ON and PMOS transistor T12 is also ON. Accordingly, VDD_CWL is equal to the IO power 25.

The control word line level shifter 32 receives an input signal (SEL_SWL) and an input signal (SELB_SWL) from the select word line level shifter 22. The control word line level shifter also receives inputs VCLMP1 and VCLMP2. The input signals SEL_SWL and SELB_SWL may be in the core domain or the IO domain while the input signal VCLMP1 and VCLMP2 may be in the IO domain. In operation, if the input signal (SEL_SWL) is a logical high value (and SELB_SWL was a logical low value), NMOS transistor T13 is ON and NMOS transistor T15 is OFF. Input signals VCLMP1 and VCLMP2 control the operation of NMOS transistors T14 and T16 and PMOS transistors T17 and T18. In some embodiments, the voltage of VCLMP2 may always by a logical high value so NMOS transistors T14 and T16 may always be ON. In some embodiments, the voltage of VCLMP1 may be a logical high value during a programming operation and a logical low value during a reading operation. However, since VCLMP1 may be in an IO domain, in some embodiments, the logical high value may not be sufficient to exceed the threshold value of the corresponding transistor. Accordingly, transistors T17 and T18 may always be ON (e.g., during a select operation (programming mode or reading mode) operation and during an unselect operation (programming mode or reading mode)). In operation, when T13 is ON (SEL_SWL is a logical high value), the output voltage at SELB_CWL is a logical low value since transistors T13 and T14 are ON. However, when the input signal SEL_SWL is a logical low value, NMOS transistor T13 is OFF, NMOS transistors T14 and T16 are ON, PMOS transistors T17 and T18 are ON, PMOS transistor T19 is ON and PMOS transistor T20 is OFF. Accordingly, the output voltage at SELB_CWL is a logical high value—either in the IO domain or the 5 V domain depending on the value of PGM_5V and PGMB_5V.

The SELB_CWL signal is sent to the control word line driver 33. As depicted in FIG. 3, the control word line driver 33 which includes transistors T21 and T22 is an inverter circuit. Accordingly, if SELB_CWL is a logical low value, the output of the control word line driver 33 is equal to VDD_CWL (T21 is ON and T22 is OFF) and if SELB_CWL is a logical high value, the output of the control word line driver 33 is equal to a logical low value (T21 is OFF and T22 is ON).

Figure 4:
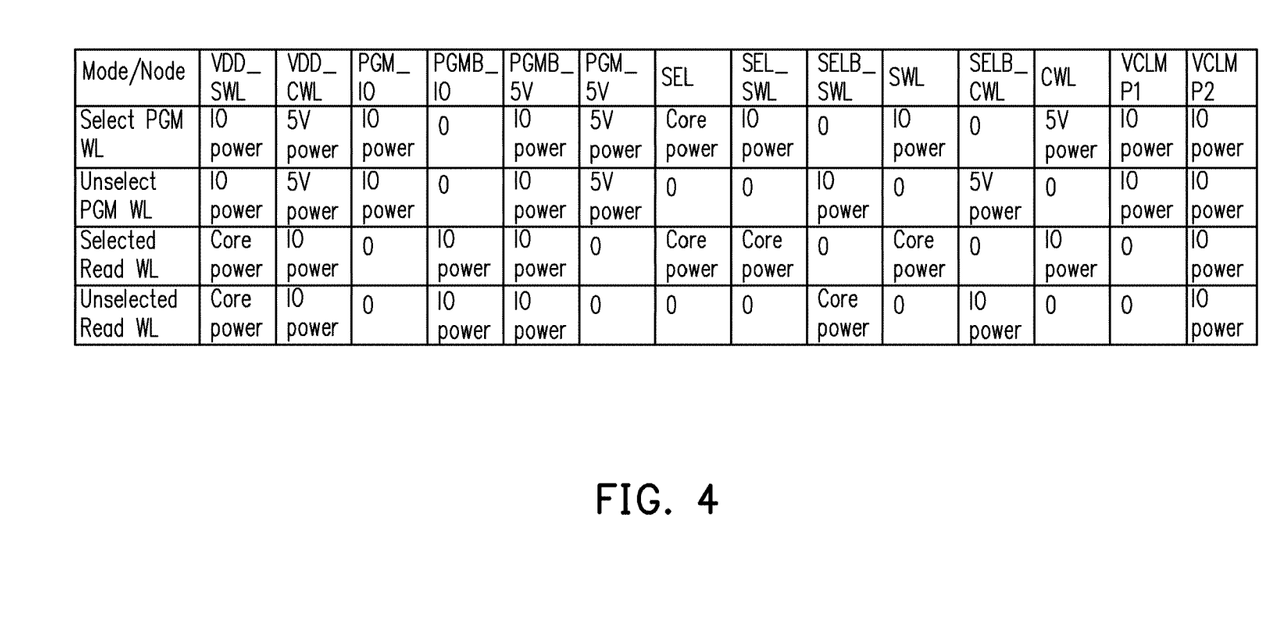
FIG. 4 is a table illustrating the operational truth table of a word line driver, in accordance with some embodiments.

FIG. 4 is a table illustrating the operational truth table of a word line driver, in accordance with some embodiments. As illustrated, the table includes a plurality of columns corresponding to the various inputs and voltages applied to the word line driver 10. The truth table summarizes the operation of the word line driver 10 illustrated in FIGS. 1-3 and includes each of the four modes of operation for the device—selection of the word line during a programming mode (Select PGM WL), unselection of the word line during a programming mode (Unselect PGM WL), selection of the word line during a reading mode (Select Read WL), and unselection of the word line during a reading mode (Unselect Read WL).

As illustrated, for the selection of the word line during a programming mode (e.g., to write data to a memory cell in an OTP non-volatile memory), inputs PGM IO=IO power, PGMB_IO=0, and SEL=core power. As a result, VDD_SWL=IO power, SEL_SWL=IO power, SELB_SLW=0, and SWL=IO power. Additionally, PGM_5V=5, PGMB_5V=IO power, VCLMP1=IO power, and VCLMP2=IO power. As a result, VDD_CWL=5, SELB_CWL=0, and CWL=5.

For the unselection of the word line during a programming mode, inputs PGM_IO=IO power, PGMB_IO=0, and SEL=0. As a result, VDD_SWL=IO power, SEL_SWL=0, SELB_SLW=IO power, and SWL=0. Additionally, PGM_5V=5, PGMB_5V=IO power, VCLMP1=IO power, and VCLMP2=IO power. As a result, VDD_CWL=5, SELB_CWL=5, and CWL=0.

For the selection of the word line during a read mode (e.g., to read data from a memory cell in an OTP non-volatile memory), inputs PGM_IO=0, PGMB_IO=IO power, and SEL=core power. As a result, VDD_SWL=core power, SEL_SWL=core power, SELB_SLW=0, and SWL=core power. Additionally, PGM_5V=0, PGMB 5V=IO power, VCLMP1=0, and VCLMP2=IO power. As a result, VDD_CWL=IO power, SELB_CWL=0, and CWL=IO power.

For the unselection of the word line during a read mode, inputs PGM_IO=0, PGMB_IO=IO power, and SEL=0. As a result, VDD_SWL=core power, SEL_SWL=0, SELB_SLW=core power, and SWL=0. Additionally, PGM_5V=0, PGMB_5V=IO power, VCLMP1=0, and VCLMP2=IO power. As a result, VDD_CWL=IO power, SELB_CWL=IO power, and CWL=0.

Figure 5:
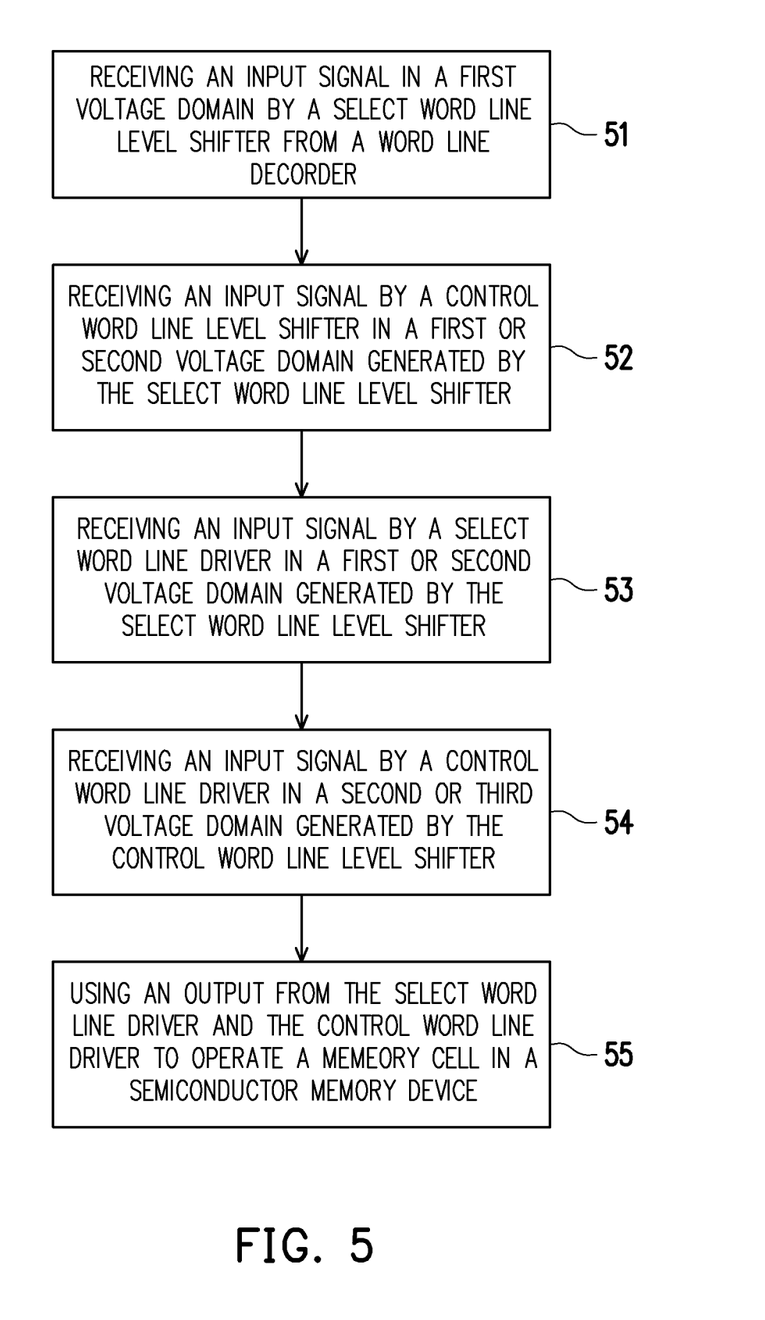
FIG. 5 is a flow chart illustrating the operation of an example of a word line driver described herein, in accordance with some embodiments.

FIG. 5 is a flow chart illustrating the operation of an example of a word line driver described herein, in accordance with some embodiments. In operation 51, the select word line level shifter 22 receives an input signal (SEL) from a word line decoder 11. In operation 52, the control word line level shifter 32 receives an input signal (SEL_SWL, SELB_SWL) in a first or second voltage domain (e.g., core domain or IO domain). The input signal SEL_SWL, SELB_SWL may be generated by the select word line shifter 22. In operation 53, a select word line driver 23 receives an input signal (SELB_SWL) from the select word line level shifter 22. The input signal (SELB_SWL) input to the select word line driver 23 may be generated by the select word line level shifter 22 and may be in a first or second voltage domain (e.g., core domain or IO domain). In operation 54, a control word line driver 33 receives an input signal (SELB_CWL) from the control word line level shifter 32. The input signal (SELB_CWL) input to the control word line driver 33 may be generated by the control word line level shifter 32 and may be in a second or third voltage domain (e.g., IO domain or 5 V domain). In operation 55, the output from the select word line driver 23 and the control word line driver 33 may be used to operate a memory cell 12 in a semiconductor memory device. In embodiments, the output from the select word line driver 23 may be in a first or second voltage domain and the output from the control word line driver 33 may be in a second or third voltage domain. In some embodiments, the output from the select word line driver 23 may be in a first voltage domain during a reading operation and in a second voltage domain during a programming operation and the output from the control word line driver 33 may be in a second voltage domain during a reading operation and in a third voltage domain during a programming operation.

Some embodiments may provide for a word line driver comprising: a select word line level shifter configured to receive an input signal in a first voltage domain and generate at least one output signal in the first voltage domain or a second voltage domain; a control word line level shifter coupled to the select word line level shifter and configured to receive at least one of the output signals generated by the select word line level shifter, the control word line level shifter further configured to generate at least one output signal in the second voltage domain or a third voltage domain; a select word line driver coupled to the select word line level shifter and configured to receive at least one of the output signals generated by the select word line level shifter, the select word line driver further configured to generate at least one output signal in the first voltage domain or the second voltage domain; and a control word line driver coupled to the control word line level shifter and configured to receive at least one of the output signals generated by the control word line level shifter, the control word line driver further configured to generate at least one output signal in the second voltage domain or the third voltage domain.

Some embodiments may provide for a word line driver comprising: a select word line level shifter configured to generate at least one output signal in the first voltage domain or a second voltage domain; and a control word line level shifter coupled to the select word line level shifter and configured to generate at least one output signal in the second voltage domain or a third voltage domain based, at least in part, on the at least one output signal generated by the select word line level shifter.

In some embodiments, the word line driver may also include a select word line driver coupled to the select word line level shifter and configured to generate at least one output signal in a voltage domain corresponding to the output voltage domain of the select word line level shifter; and a control word line driver coupled to the control word line level shifter and configured to generate at least one output signal in a voltage domain corresponding to the output voltage domain of the control word line level shifter.

Some embodiments may provide for a method for operating a word line driver comprising: receiving a first input signal in a first voltage domain by a select word line level shifter from a word line decoder; receiving at least one input signal by a control word line level shifter in a first voltage domain or a second voltage domain, the at least one input signal being generated by the select word line level shifter; receiving at least one input signal by a select word line driver in a first voltage domain or a second voltage domain, the at least one input signal being generated by the select word line level shifter; receiving at least one input signal by a control word line driver in a second voltage domain or third voltage domain, the at least one input signal being generated by the control word line level shifter; and using an output from the select word line driver and the control word line driver to operate a memory cell in a semiconductor memory device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A word line driver comprising:
   a select word line level shifter configured to receive an input signal in a first voltage domain and generate at least one output signal in the first voltage domain or a second voltage domain;
   a control word line level shifter coupled to the select word line level shifter and configured to receive at least one of the output signals generated by the select word line level shifter, the control word line level shifter further configured to generate at least one output signal in the second voltage domain or a third voltage domain;
   a select word line driver coupled to the select word line level shifter and configured to receive at least one of the output signals generated by the select word line level shifter, the select word line driver further configured to generate at least one output signal in the first voltage domain or the second voltage domain; and
   a control word line driver coupled to the control word line level shifter and configured to receive at least one of the output signals generated by the control word line level shifter, the control word line driver further configured to generate at least one output signal in the second voltage domain or the third voltage domain.

2. The word line driver of claim 1, further comprising a word line decoder for generating the input signal in the first voltage domain provided to the select word line level shifter.

3. The word line driver of claim 1, further comprising a select word line header configured to control the voltage output domain of the select word line level shifter and a control word line header configured to control the voltage output domain of the control word line level shifter.

4. The word line driver of claim 1, wherein the output signal generated by the select word line driver is configured to control a corresponding select word line associated with at least one memory cell.

5. The word line driver of claim 1, wherein the output signal generated by the control word line driver is configured to control a corresponding control word line associated with at least one memory cell.

6. The word line driver of claim 1, wherein the word line driver is implemented in a one-time programmable semiconductor memory device.

7. The word line driver of claim 1, wherein the third voltage domain is higher than the second voltage domain and the second voltage domain is higher than the first voltage domain.

8. The word line driver of claim 1, wherein the output signal generated by the select word line level shifter and the select word line driver are in the first voltage domain during a read operation and in the second voltage domain during a programming operation.

9. The word line driver of claim 1, wherein the output signal generated by the control word line level shifter and the control word line driver are in the second voltage domain during a read operation and in the third voltage level domain a programming operation.

10. A word line driver comprising:
    a select word line level shifter configured to generate at least one output signal in the first voltage domain or a second voltage domain; and
    a control word line level shifter coupled to the select word line level shifter and configured to generate at least one output signal in the second voltage domain or a third voltage domain based, at least in part, on the at least one output signal generated by the select word line level shifter;
    a select word line header configured to control the voltage output domain of the select word line level shifter; and
    a control word line header configured to control the voltage output domain of the control word line level shifter.

11. The word line driver of claim 10, further comprising:
    a select word line driver coupled to the select word line level shifter and configured to generate at least one output signal in a voltage domain corresponding to the output voltage domain of the select word line level shifter; and
    a control word line driver coupled to the control word line level shifter and configured to generate at least one output signal in a voltage domain corresponding to the output voltage domain of the control word line level shifter.

12. The word line driver of claim 11, wherein the output signal generated by the select word line driver is configured to control a corresponding select word line associated with at least one memory cell.

13. The word line driver of claim 11, wherein the output signal generated by the control word line driver is configured to control a corresponding control word line associated with at least one memory cell.

14. The word line driver of claim 11, wherein the output signal generated by the select word line level shifter and the select word line driver are in the first voltage domain during a read operation and in the second voltage domain during a programming operation.

15. The word line driver of claim 11, wherein the output signal generated by the control word line level shifter and the control word line driver are in the second voltage domain during a read operation and in the third voltage level domain a programming operation.

16. The word line driver of claim 10, further comprising a word line decoder for generating an input signal in the first voltage domain and providing the input signal to the select word line level shifter.

17. The word line driver of claim 10, wherein the word line driver is implemented in a one-time programmable semiconductor memory device.

18. A method for operating a word line driver comprising:
    receiving a first input signal in a first voltage domain by a select word line level shifter from a word line decoder;
    receiving at least one input signal by a control word line level shifter in a first voltage domain or a second voltage domain, the at least one input signal being generated by the select word line level shifter;
    receiving at least one input signal by a select word line driver in a first voltage domain or a second voltage domain, the at least one input signal being generated by the select word line level shifter;
    receiving at least one input signal by a control word line driver in a second voltage domain or third voltage domain, the at least one input signal being generated by the control word line level shifter; and
    using an output from the select word line driver and the control word line driver to operate a memory cell in a semiconductor memory device.

19. The method of claim 18, wherein the output signal generated by the select word line level shifter and the select word line driver are in the first voltage domain during a read operation and in the second voltage domain during a programming operation.

20. The method of claim 18, wherein the output signal generated by the control word line level shifter and the control word line driver are in the second voltage domain during a read operation and in the third voltage level domain a programming operation.

\* \* \* \* \*